United States Patent
Hu et al.

(10) Patent No.: US 9,615,445 B2
(45) Date of Patent: Apr. 4, 2017

(54) FLEXIBLE CIRCUIT BOARD AND METHOD FOR MANUFACTURING SAME

(71) Applicants: FuKui Precision Component (Shenzhen) Co., Ltd., Shenzhen (CN); HongQiSheng Precision Electronics (QinHuangDao) Co., Ltd., Qinhuangdao (CN); Zhen Ding Technology Co., Ltd., Tayuan, Taoyuan (TW)

(72) Inventors: Xian-Qin Hu, Qinhuangdao (CN); Fu-Yun Shen, Shenzhen (CN); Ming-Jaan Ho, New Taipei (TW); Yi-Qiang Zhuang, Shenzhen (CN)

(73) Assignees: FuKui Precision Component (Shenzhen) Co., Ltd., Shenzhen (CN); GARUDA TECHNOLOGY CO., LTD., New Taipei (TW); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 10 days.

(21) Appl. No.: 14/858,652

(22) Filed: Sep. 18, 2015

(65) Prior Publication Data
US 2016/0381786 A1 Dec. 29, 2016

(30) Foreign Application Priority Data
Jun. 24, 2015 (CN) .......................... 2015 1 0352028

(51) Int. Cl.
*H05K 1/00* (2006.01)
*H05K 1/02* (2006.01)
(Continued)

(52) U.S. Cl.
CPC ......... *H05K 1/0216* (2013.01); *H05K 1/0237* (2013.01); *H05K 1/09* (2013.01); *H05K 3/06* (2013.01)

(58) Field of Classification Search
CPC .......... H05K 1/24; H05K 1/219; H05K 1/224; H05K 3/10; H05K 3/222; H01L 23/58;
(Continued)

(56) References Cited

U.S. PATENT DOCUMENTS

| | | | |
|---|---|---|---|
| 7,046,497 B1* | 5/2006 | Bonin | H01G 5/14 361/272 |
| 7,298,234 B2* | 11/2007 | Dutta | H01P 1/2005 333/236 |

(Continued)

*Primary Examiner* — Xiaoliang Chen
(74) *Attorney, Agent, or Firm* — Zhigang Ma

(57) ABSTRACT

A flexible circuit board includes two copper clad laminates, a circuit pattern and two bonding layers. Each copper clad laminate includes an insulating base and an outer circuit layer. The circuit pattern is located between the two copper clad laminates. The circuit pattern includes a linear signal line, two grounding lines located at two opposite sides of the linear signal line, and two hollow areas located between the linear signal line and the grounding lines. Each bonding layers is located between the circuit pattern and a corresponding copper clad laminate. Each boding layer defines a slot without adhesive therein. The bonding layers are spaced from the linear signal line by the slots. The slots and the hollow areas cooperatively define an air medium layer enclosing the linear signal line. A method for manufacturing the flexible circuit board is also provided.

20 Claims, 6 Drawing Sheets

(51) Int. Cl.
*H05K 1/09* (2006.01)
*H05K 3/06* (2006.01)

(58) Field of Classification Search
CPC ... H01L 23/66; H01P 1/18; H01P 1/20; H01P 3/03; H01P 3/08; H01P 3/88; H01P 5/02; H01P 5/10
USPC .......... 174/254; 361/290, 272, 277; 333/33, 333/161, 164, 204, 236, 238, 245, 246; 257/691, 698, 700; 439/493
See application file for complete search history.

(56) References Cited

U.S. PATENT DOCUMENTS

| | | | | |
|---|---|---|---|---|
| 8,022,308 | B2* | 9/2011 | Hu | H05K 1/0219 |
| | | | | 174/254 |
| 2003/0011390 | A1* | 1/2003 | Smith | G01R 1/07378 |
| | | | | 324/754.03 |
| 2005/0156307 | A1* | 7/2005 | Takahashi | H01L 23/66 |
| | | | | 257/691 |
| 2005/0168304 | A1* | 8/2005 | Yamaguchi | H01P 3/088 |
| | | | | 333/246 |
| 2007/0066126 | A1* | 3/2007 | Dutta | H05K 1/024 |
| | | | | 439/493 |
| 2007/0139133 | A1* | 6/2007 | Kwon | H01P 5/10 |
| | | | | 333/33 |
| 2008/0048800 | A1* | 2/2008 | Dutta | H01L 23/66 |
| | | | | 333/161 |
| 2008/0078573 | A1* | 4/2008 | Hu | H05K 1/0219 |
| | | | | 174/262 |
| 2009/0121811 | A1* | 5/2009 | Choi | H01P 1/2013 |
| | | | | 333/204 |
| 2010/0007431 | A1* | 1/2010 | Chu | H01P 3/087 |
| | | | | 333/33 |

* cited by examiner

FLEXIBLE CIRCUIT BOARD AND METHOD FOR MANUFACTURING SAME

FIELD

The subject matter herein generally relates to printed circuit boards, and particularly to a flexible circuit board and a method for manufacturing the flexible circuit board.

BACKGROUND

Generally, flexible circuit boards are light, soft, thin, small, ductile, flexible, and supporting high wiring density. Flexible circuit boards can be three-dimensionally wired and shaped according to space limitations. Flexible circuits are generally useful for electronic packages where flexibility, weight control and the like are important.

FIG. 10 illustrates a high frequency signal line structure 100 of a conventional flexible circuit board. The high frequency signal line structure 100 includes two grounding pattern layers 110, a signal line 120 and two medium layers 130 and a plurality of conductive holes 150. The two medium layers 130 entirely and directly contact and enclose the signal line 120, the signal line 120 is sandwiched between the two medium layers 130.

FIG. 11 illustrates that the plurality of conductive holes 150 are evenly distributed at two opposite sides of the signal line 120 and electrically connect the two grounding pattern layers 110. In other words, the grounding pattern layers 110, the plurality of conductive holes 150 are located around the signal line 120, to thereby make a construction of the high frequency signal line structure 100 like a coaxial cable.

A total loss of high frequency signals passing through the signal line 120 is directly determined by line width, impedance of the signal line 120 and a needed signal transmission frequency. The total loss includes loss from the signal line 120 and loss from the medium layers 130. When the signal transmission frequency of the signal line 120 increasing, the loss from the medium layers 130 is greater than the loss from the signal line 120, namely the loss from the medium layers 130 becomes a main factor affecting the total loss of the high frequency signals passing through the signal line 120. Therefore, in order to effectively reduce the total loss, how to reduce dielectric constant of the medium layers 130 is a difficult for the industry to face.

A typical material of the medium layers 130 is selected from teflon, liquid crystal polymer or pure glue with low dielectric constant, in order to reduce the loss from the medium layers 130. Teflon or liquid crystal polymer, however, still has a high dielectric constant, for example, the dielectric constant of teflon is 2.1 farad/meter (F/m), the dielectric constant of liquid crystal polymer is 3.2 farad/meter (F/m). In addition, teflon and liquid crystal polymers are special material, and have high cost, even are monopolized by the main material suppliers.

BRIEF DESCRIPTION OF THE DRAWINGS

Implementations of the present technology will now be described, by way of example only, with reference to the attached figures.

DETAILED DESCRIPTION

Figure 1:
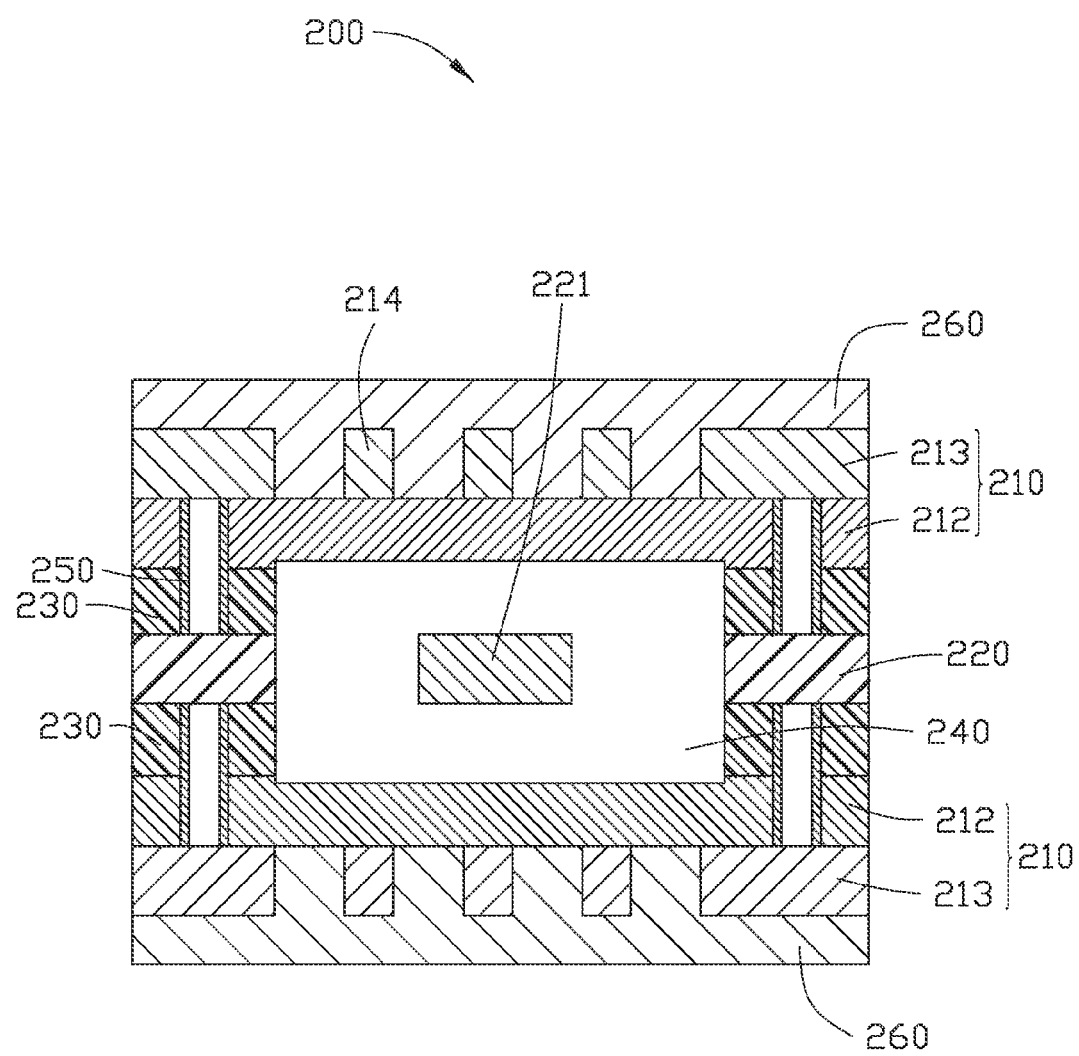
FIG. 1 is cross sectional view of a flexible circuit board in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a flexible circuit board. The flexible circuit board can include two copper clad laminates, a circuit pattern and two bonding layers. Each copper clad laminate can include an insulating base and an outer circuit layer. The circuit pattern is located between the two copper clad laminates. The circuit pattern can include a linear signal line, two grounding lines located at two opposite sides of the linear signal line, and two hollow areas located between the linear signal line and the grounding lines. Each bonding layer is located between the circuit pattern and a corresponding copper clad laminate. Each of the boding layers defines a slot without adhesive therein. The bonding layers are spaced from the linear signal line by the slots. The slots of the two bonding layers and the two hollow areas of the circuit pattern cooperatively define an air medium layer enclosing the linear signal line.

The present disclosure is described further in relation to a method for manufacturing a flexible circuit board. The method can include followings. Two copper clad laminates each comprising a copper foil and an insulating base are provided. A circuit pattern is formed to comprise a linear signal line, two grounding lines located at two opposite sides of the linear signal line, and two hollow areas located between the linear signal line and corresponding grounding lines. Two bonding layers each defining a slot without adhesive therein are provided. The two bonding layers are positioned between the circuit pattern and corresponding copper clad laminates. The copper clad laminates, the bonding layers and the circuit pattern are laminated together to form an air medium layer enclosing the linear signal line.

FIG. 1 illustrates a flexible circuit board 200 of an embodiment of the present disclosure. The flexible circuit board 200 can include a plurality of copper clad laminates 210, a circuit pattern 220, a plurality of bonding layers 230 and a plurality of conductive holes 250. The plurality of copper clad laminates 210 are located at two opposite sides of the circuit pattern 220. The plurality of bonding layer 230 are located at two opposite sides of the circuit pattern 220, and between corresponding copper clad laminate 210 and the circuit pattern 220. In at least one embodiment, a number of the copper clad laminate 210 are two. A number of the bonding layers 230 are two. Each bonding layer 230 is corresponding to the corresponding copper clad laminate 210 and located between the copper clad laminate 210 and the circuit pattern 220.

FIG. 1 illustrates that each copper clad laminate 210 can include an insulating base 212 and an outer circuit layer 213. In at least one embodiment, the copper clad laminate 210 can be a flexible copper clad laminate (FCCL). The copper clad laminate 210 can be a single-sided FCCL.

The insulating base 212 can be a base layer of the copper clad laminate 210. The insulating base 212 can be flexible and provide support to the copper clad laminate 210. The insulating base 212 can be polyimide (PI).

The outer circuit layer 213 is copper foil layer laminated on the insulating base 212. The outer circuit layer 213 can have a thickness of 18 micrometers, 12 micrometers or other. The outer circuit layer 213 is configured to connect external components. In at least one embodiment, the outer circuit layer 213 can include a plurality of connecting pads 214 configured to connect the external components, such as passive components (capacitors, resistors and inductors) or active components (chip), etc. The connecting pads 214 can be spaced from each other.

In at least one alternative embodiment, the outer circuit layer 213 can be in a grid pattern or an integrated copper face, which can protect internal wiring of the flexible circuit board 200 from signal interference.

Figure 2:
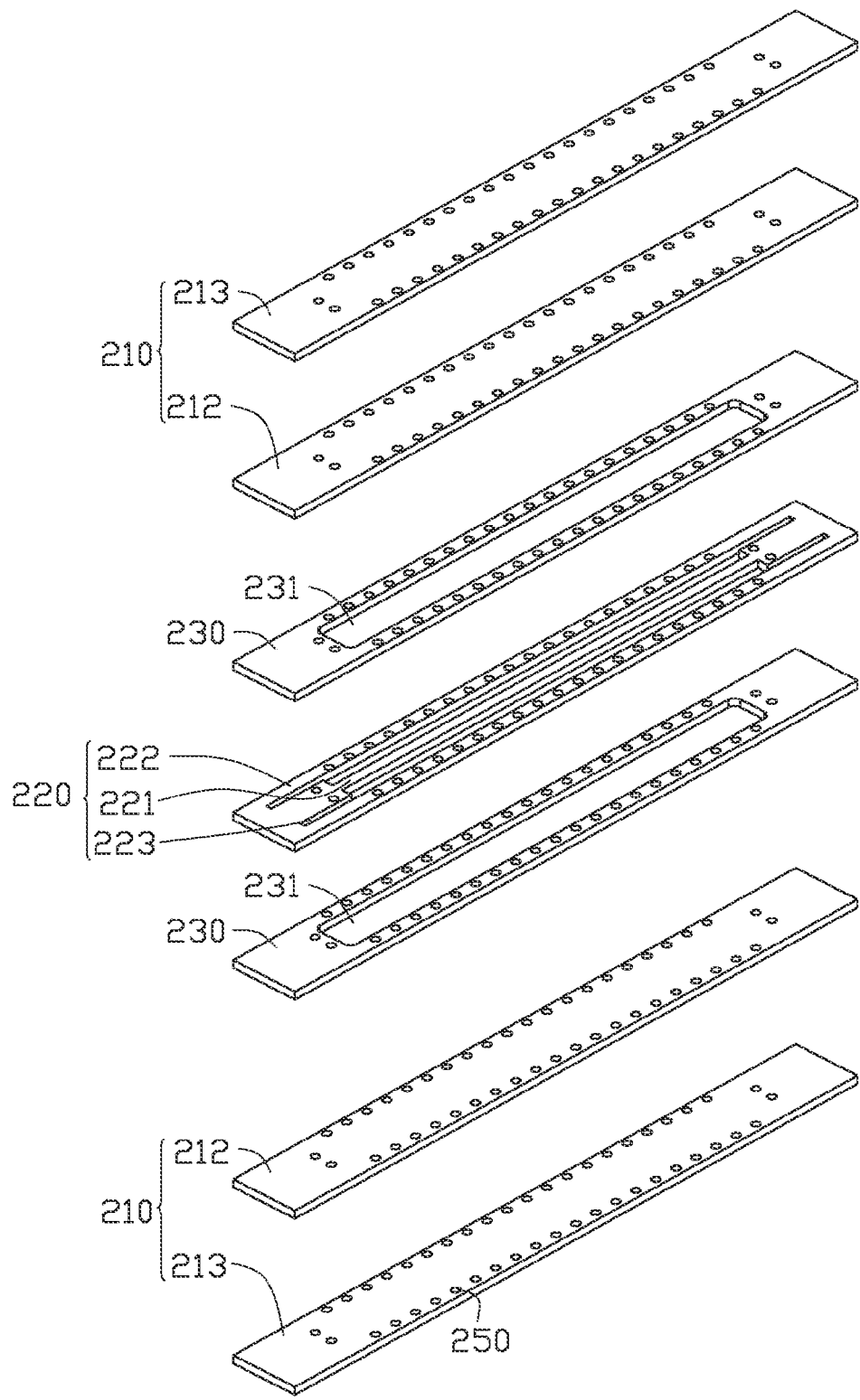
FIG. 2 is diagrammatic, isometric view the flexible circuit board in FIG. 1, without solder resist layers, and before an outer circuit layer being formed.

FIG. 2 illustrates that the circuit pattern 220 can include a linear signal line 221, two grounding lines 222 and two hollow areas 223. The linear signal line 221 is located at a center portion of the circuit pattern 220. The two grounding lines 222 are located at two opposite sides of the linear signal line 221. The two hollow areas 223 are located at two opposite sides of the linear signal line 221 and between the two grounding lines 222.

In at least one embodiment, the linear signal line 221 can be electrically independent from two grounding lines 222. The linear signal line 221 is configured to transmit signals.

The two grounding lines 222 can be parallel to each other. In at least one embodiment, the two grounding lines 222 can be symmetric to each other about the linear signal line 221.

Each hollow area 223 is located between the linear signal line 221 and a corresponding grounding line 222. The two hollow areas 223 separate the linear signal line 221 apart from the two grounding lines 222. The two hollow areas 23 can be symmetric to each other about the linear signal line 221.

FIG. 1 and FIG. 2 illustrate that each bonding layer 230 is stacked between the circuit pattern 220 and the corresponding copper clad laminate 210. In at least one embodiment, each bonding layer 230 only contacts the grounding lines 222 of the circuit pattern 220, and is spaced from the linear signal line 221 of the circuit pattern 220.

Each bonding layer 230 defines a slot 231 without adhesive therein. In at least one embodiment, the slot 231 has nothing therein. In at least one embodiment, the slot 231 is defined in a central portion of the bonding layer 230 corresponding to the linear signal line 221 of the circuit pattern 220. The two slots 231 of the two bonding layers 230 and the two hollow areas 223 of the circuit pattern 220 cooperatively define an air medium layer 240 enclosing the linear signal line 221 in three-dimensions. The air medium layer 240 is enclosed by the insulating bases 212 of the two copper clad laminates 210, the bonding layers 230 and the grounding lines 222 of the circuit pattern 220. In at least one embodiment, the slots 231 are corresponding to the linear signal line 221 and the two hollow areas 223 at two sides of the linear signal line 221. Each slot 231 has a size no less than a size of the linear signal line 221. Each slot 231 has a width larger than a width of the linear signal line 221. Each slot 231 has a length no less than a length of the linear signal line 221. In at least one embodiment, each slot 231 can have a width substantially equal to a total width of the linear signal line 221 and the two hollow areas 223.

The linear signal line 221 is spaced from the two bonding layers 30 via the two slots 231. The linear signal line 221 can be in dangling state in which the linear signal line 221 is in the air medium layer 240, and is spaced from other components by the air medium layer 240. A dielectric constant of the air medium layer is 1.0 farad/meter, which is less than a dielectric constant of Teflon or liquid crystal polymer, so that, after signals are transmitted by the linear signal line 221, loss of the signals is reduced.

The plurality of conductive holes 250 can be defined in the two copper clad laminates 210, the circuit pattern 220 and the bonding layers 230. The plurality of conductive holes 250 can be through holes or blind holes. Each of the conductive holes 250 is filled with electric conductive material. In at least one embodiment, each conductive hole 250 extends through the insulating bases 212 of the copper clad laminates 210, the circuit pattern 220 and the bonding layers 230. The plurality of conductive holes 250 can be evenly and spaced defined in the two copper clad laminates 210, the circuit pattern 220 and the bonding layers 230. Alternatively, the plurality of conductive holes 250 can be unevenly and spaced defined in the copper clad laminates 210, the circuit pattern 220 and the bonding layers 230. The conductive holes 250 electrically connect the outer circuit layers 213 of the copper clad laminates 210 and the grounding lines 222 of circuit pattern 220.

In the circuit pattern 220, the conductive holes 250 are located around the linear signal line 221. In the bonding layer 230, the conductive holes 250 are located around the slot 231.

The grounding lines 222 and the outer circuit layers 213 cooperative form an electromagnetic shielding structure around linear signal line 221 via the conductive holes 250.

In at least one embodiment, the conductive holes 250 are only defined in the copper clad laminates 210 and the bonding layers 230.

FIG. 1 illustrates that the flexible circuit board 200 can further include two solder resist layers 260 covering on corresponding outer circuit layers 213 of the copper clad laminates 210. In at least one embodiment, each solder resist layer 260 can cover the corresponding outer circuit layer 213 on the insulating base 212. Each solder resist layer 260 can be filled in a space between two adjacent connecting pads 214 of the outer circuit layer 213. The solder resist layer 260 can directly contact the insulating base 212 in the space.

Figure 3:
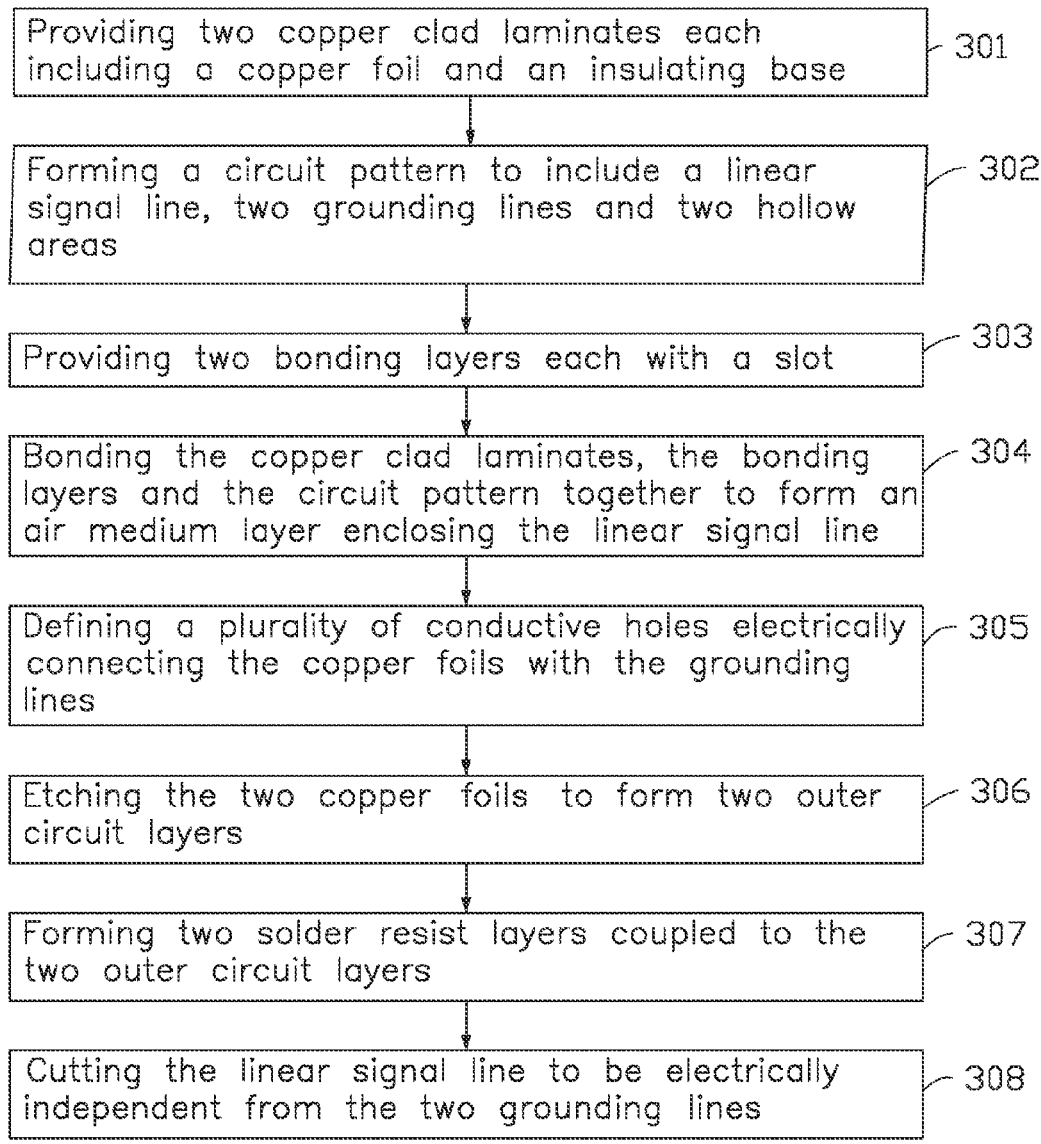
FIG. 3 is a flowchart of a method for manufacturing the flexible circuit board in FIG. 1.

FIG. 3 illustrates a flowchart of an example method for manufacturing the flexible circuit board 200. The example method is provided by way of example, as there are a variety of ways to carry out the method. The example method described below can be carried out using the configurations illustrated in FIGS. 1, 2 and 4-9, for example, and various elements of these figures are referenced in explaining the example method. Each block shown in FIG. 3 represents one or more processes, methods or subroutines, carried out in the example method. Furthermore, the illustrated order of blocks is illustrative only and the order of the blocks can change according to the present disclosure. Additional blocks can be added or fewer blocks may be utilized, without departing from this disclosure. The example method can begin at block 301.

Figure 4:
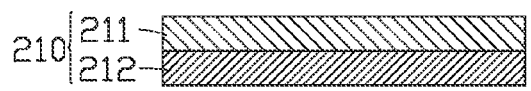
FIG. 4 is a cross sectional view of a copper clad laminate of the flexible circuit board in FIG. 1 before an outer circuit layer being formed.

At block 301, also referring to FIG. 4, a plurality of copper clad laminates 210 are provided. In at least one embodiment, a number of the copper clad laminates 210 can be two. Each copper clad laminate 210 includes a copper foil 211 and an insulating base 212 supporting the copper foil 211. The copper clad laminate 210 can be a single-sided FCCL. The insulating base 212 can be PI. The insulating base 212 is a base layer of the copper clad laminate 210. The insulating base 212 is flexible and acts as a support layer of the copper clad laminate 210.

Figure 5:
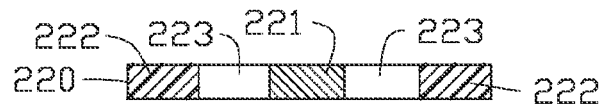
FIG. 5 is a cross sectional view of a circuit pattern of the flexible circuit board in FIG. 1.

At block 302, also referring to FIG. 5, a circuit pattern 220 is formed. The circuit pattern 220 can include a linear signal line 221 and two parallel grounding lines 222 at two opposite sides of the linear signal line 221, and two hollow areas 223 located between the linear signal line 221 and corresponding grounding lines 222. The linear signal line 221 has two opposite ends connected to the two grounding lines 222. The circuit pattern 220 is formed by etching, punching or cutting. In at least one embodiment, the circuit pattern 220 is formed by etching a fine copper plate or a fine copper foil which only has metal of copper without other element.

Figure 6:
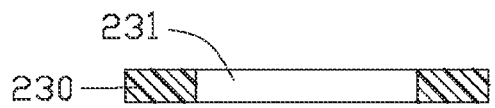
FIG. 6 is a cross sectional view of a bonding layer of the flexible circuit board in FIG. 1.

At block 303, also referring to FIG. 6, a plurality of bonding layers 230 each with a slot 231 are provided. The slot 231 has no adhesive therein. In at least one embodiment, the plurality of bonding layers 230 are punched to form the slots 231. Each of the slots 231 has a size no less than a size of the linear signal line 221. In at least one embodiment, a number of the bonding layers 230 are two.

Figure 7:
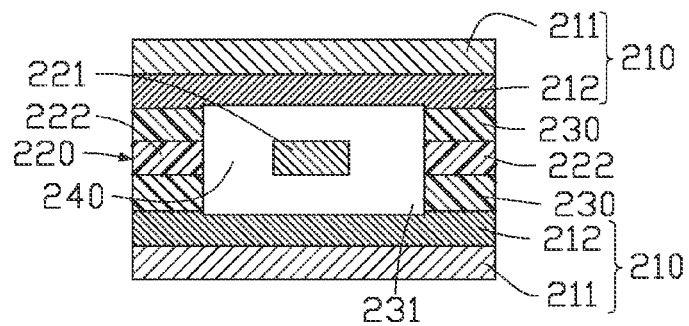
FIG. 7 is a cross sectional view of a bonding structure of the copper clad laminates in FIG. 4, the circuit pattern in FIG. 5 and the bonding layers in FIG. 6

At block 304, also referring to FIG. 7, the circuit pattern 220, the bonding layers 230 and the copper clad laminates 210 are bonded together. The two copper clad laminates 210 are positioned at two opposite sides of the circuit pattern 220. The two bonding layers 230 positioned between the circuit pattern 220 and corresponding copper clad laminates 210. The copper clad laminates 210, the circuit pattern 220 and the bonding layers 230 are laminated together. The bonding layers 230 adhere the copper clad laminates 210 with the circuit pattern 220. The bonding layers 230 have first faces adhered to the insulating bases 212 of the copper clad laminates 210, and second faces adhered to two opposite sides of the grounding lines 222 of the circuit pattern 220. The bonding layers 230 only contact the grounding lines 222 of the circuit pattern 220, and are spaced from the linear signal line 221 of the circuit pattern 220 by the slots 231. The hollow areas 223 of the circuit pattern 220 and the slots 231 of the bonding layers 230 cooperatively define an air medium layer 240 enclosing the linear signal line 221 in three dimensions. The air medium layer 240 is enclosed by the insulating bases 212, the bonding layers 230 and the grounding lines 222. The linear signal line 221 is hung in the air medium layer 240. A dielectric constant of the air medium layer is 1.0 farad/meter, which is less than a dielectric constant of Teflon or liquid crystal polymer.

Figure 8:
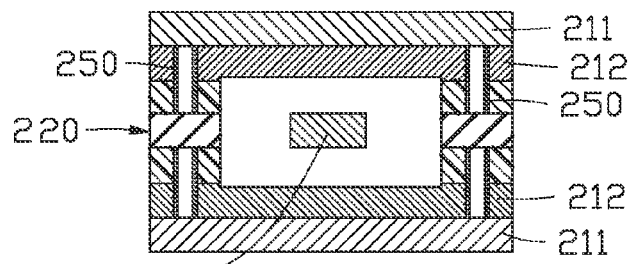
FIG. 8 shows the bonding structure in FIG. 7 with a plurality of conductive holes being defined.

At block 305, also referring to FIG. 8, a plurality of conductive holes 250 are defined in the copper clad laminates 210, the circuit pattern 220 and the bonding layers 230 to electrically connect the copper foils 211 of the copper clad laminates 210 with the grounding lines 222 of the circuit pattern 220. The plurality of conductive holes 250 can be evenly and spaced defined in the copper clad laminates 210, the circuit pattern 220 and the bonding layers 230. Alternatively, the plurality of conductive holes 250 can be unevenly and spaced defined in the copper clad laminates 210, the circuit pattern 220 and the bonding layers 230. The plurality of conductive holes 250 can be through holes or blind holes. In at least one embodiment, the plurality of conductive holes 250 are defined by mechanically punching or laser etching along a direction from the insulating base 212 of one copper clad laminate 210 to the insulating base 212 of the other copper clad laminate 210. In at least one alternative embodiment, the plurality of conductive holes 250 are defined by mechanically punching or laser etching along directions from the insulating bases 212 of the copper clad laminates 210 to the grounding lines 222 of the circuit pattern 220. The plurality of conductive holes 250 are filled with electric conductive material.

In at least one embodiment, the conductive holes 250 are only defined in the copper clad laminates 210 and the bonding layers 230.

Figure 9:
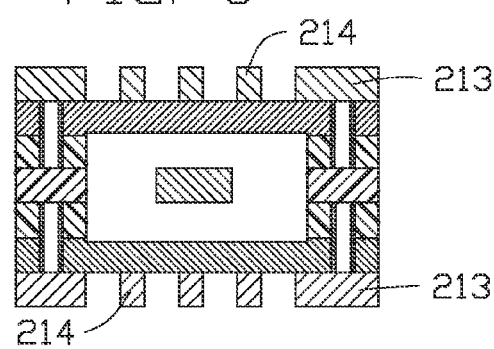
FIG. 9 shows the bonding structure in FIG. 8 with the outer circuit layers being formed.
Figure 10:
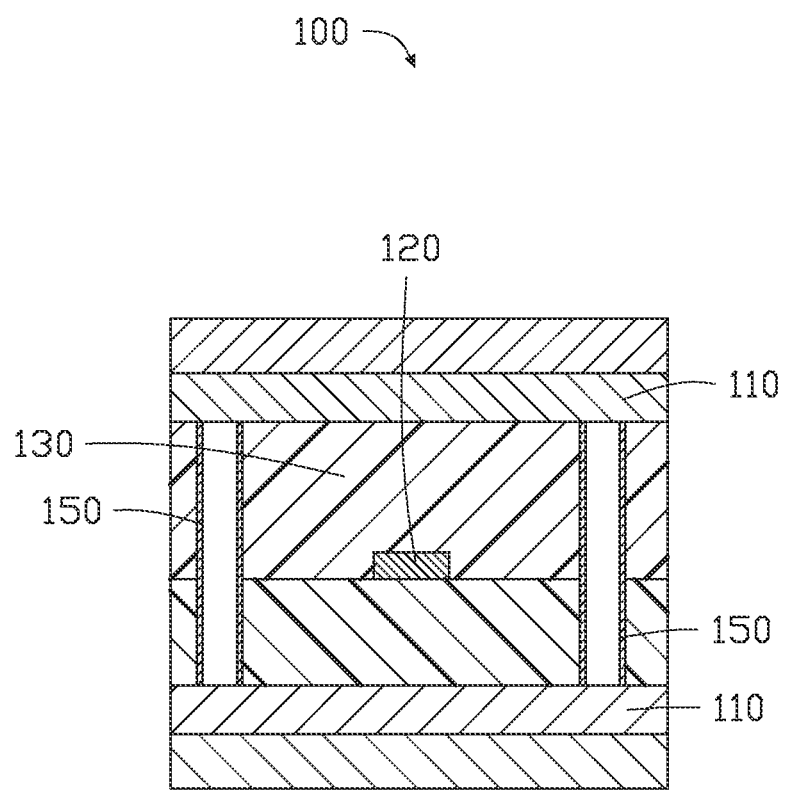
FIG. 10 is a cross sectional view of a high frequency signal line structure of a conventional flexible circuit board.
Figure 11:
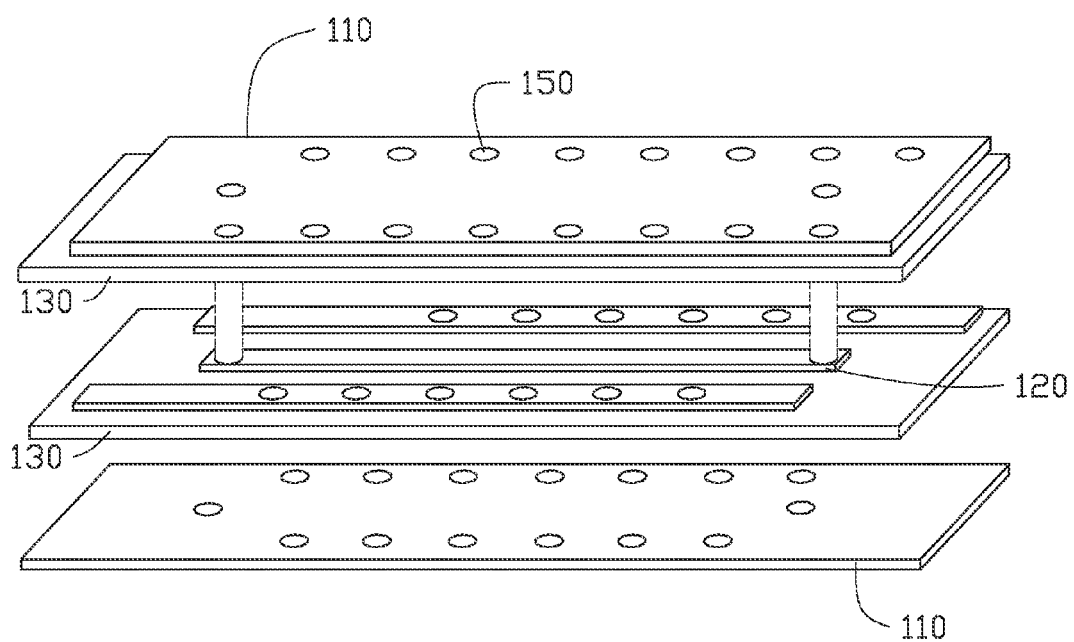
FIG. 11 is an isometric view of the high frequency signal line structure in FIG. 10.

At block 306, also referring to FIG. 9, the copper foils 211 of the two copper clad laminates 210 are etched to form two outer circuit layers 213. In at least one embodiment, the outer circuit layer 213 can include a plurality of connecting pads 214 configured to connect the external components, such as passive components (capacitors, resistors and inductors) or active components (chip), etc. The connecting pads 214 can be spaced from each other. In at least one alternative embodiment, the outer circuit layer 213 can be in a grid pattern or an integrated copper face, which can protect the linear signal line 221 from signal interference.

At block 307, also referring to FIG. 1, two solder resist layers 260 are formed to the outer circuit layers 213. In at least one embodiment, each solder resist layer 260 can cover the corresponding outer circuit layer 213 on the insulating base 212. Each solder resist layer 260 can be filled in a space between two adjacent connecting pads 214 of the outer circuit layer 213. The solder resist layer 260 can directly contact the insulating base 212 in the space. In at least one embodiment, each solder resist layer 260 is formed by coverlay (CVL) or printing ink, according demand of the different line widths/line spacing.

At block 308, also referring to FIG. 2, the linear signal line 221 is cut to be electrically independent from the two grounding lines 222. The linear signal line 221 is configured to transmit signals.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A flexible circuit board comprising:
    two copper clad laminates, each comprising an insulating base and an outer circuit layer;
    a circuit pattern located between the two copper clad laminates, and comprising a linear signal line, two grounding lines located at two opposite sides of the linear signal line, and two hollow areas located between the linear signal line and the grounding lines; and
    two bonding layers, each located between the circuit pattern and a corresponding copper clad laminate, each of the boding layers defining a slot without adhesive therein;
    wherein the bonding layers are spaced from the linear signal line by the slots, the slots of the two bonding layers and the two hollow areas of the circuit pattern cooperatively defining an air medium layer enclosing the linear signal line.

2. The flexible circuit board of claim 1, wherein the slots of the two bonding layers are corresponding to the linear signal line of the circuit pattern.

3. The flexible circuit board of claim 2, wherein each of the slots has a size no less than a size of the linear signal line of the circuit pattern.

4. The flexible circuit board of claim 3, wherein each of the slots has a width larger than that of the linear signal line of the circuit pattern, and a length no less than that of the linear signal line.

5. The flexible circuit board of claim 3, wherein each of the slots has a width equal to a total width of the linear signal line and the two hollow areas of the circuit pattern.

6. The flexible circuit board of claim 1, wherein the two grounding lines of the circuit pattern are parallel to each other.

7. The flexible circuit board of claim 1, wherein the two grounding lines is symmetric to each other about the linear signal line of the circuit pattern.

8. The flexible circuit board of claim 1, wherein the linear signal line is electrically independent from two grounding lines of the circuit pattern.

9. The flexible circuit board of claim 1, wherein the outer circuit layer comprises a plurality of spaced connecting pads.

10. The flexible circuit board of claim 1, wherein the insulating base is flexible.

11. The flexible circuit board of claim 1, further comprising a plurality of conductive holes electrically connecting the outer circuit layers with the grounding lines of the circuit pattern.

12. The flexible circuit board of claim 1, further comprising two solder resist layers covering corresponding outer circuit layers of the copper clad laminates.

13. A method for manufacturing a flexible circuit board, comprising:
    providing two copper clad laminates each comprising a copper foil and an insulating base;
    forming a circuit pattern to comprise a linear signal line, two grounding lines located at two opposite sides of the linear signal line, and two hollow areas located between the linear signal line and corresponding grounding lines;
    providing two bonding layers each defining a slot without adhesive therein; and
    positioning the two bonding layers between the circuit pattern and corresponding copper clad laminates, and laminating the copper clad laminates, the bonding layers and the circuit pattern together to form an air medium layer enclosing the linear signal line.

14. The method of claim 13, wherein the bonding layers only contact the grounding lines of the circuit pattern, and are spaced from the linear signal line of the circuit pattern.

15. The method of claim 13, after laminating the copper clad laminates, the bonding layers and the circuit pattern together, further comprising: defining a plurality of conductive holes are in the copper clad laminates and the bonding layers to electrically connect the copper foils of the copper clad laminates with the grounding lines of the circuit pattern.

16. The method of claim 13, further comprising: etching the copper foils of the two copper clad laminates to form two outer circuit layers of the two copper clad laminates.

17. The method of claim 13, further comprising: forming two solder resist layers respectively covering the outer circuit layers.

18. The method of claim 13, further comprising: cutting the linear signal line to be electrically independent from the two grounding lines.

19. The method of claim 13, wherein the insulating base is flexible.

20. The method of claim 13, wherein the air medium layer is enclosed by the insulating bases of the copper clad laminates, the bonding layers and the grounding lines of the circuit pattern.

* * * * *